(12) United States Patent
Turudic (10) Patent No.: US 7,908,528 B1
(45) Date of Patent: Mar. 15, 2011

(54) PHASE-DETECTOR-LESS METHOD AND APPARATUS FOR MINIMIZING SKEW BETWEEN BONDED CHANNEL GROUPS

(75) Inventor: Andy Turudic, San Jose, CA (US)

(73) Assignee: Altera Corporation, San Jose, CA (US)

( * ) Notice: Subject to any disclaimer, the term of this patent is extended or adjusted under 35 U.S.C. 154(b) by 565 days.

(21) Appl. No.: 11/747,152

(22) Filed: May 10, 2007

Related U.S. Application Data

(60) Provisional application No. 60/828,659, filed on Oct. 9, 2006.

(51) Int. Cl.
*G01R 31/3193* (2006.01)
*G01R 31/40* (2006.01)

(52) U.S. Cl. .......................... 714/715; 714/700

(58) Field of Classification Search ................. None
See application file for complete search history.

(56) References Cited

U.S. PATENT DOCUMENTS

| | | | |
|---|---|---|---|
| 5,399,991 A * | 3/1995 | Moraveji | 330/255 |
| 5,917,873 A * | 6/1999 | Shiomoto et al. | 375/376 |
| 6,430,235 B1 * | 8/2002 | O'Shea et al. | 375/326 |
| 6,763,057 B1 * | 7/2004 | Fullerton et al. | 375/141 |
| 6,963,966 B1 * | 11/2005 | Carrillo | 712/37 |
| 7,366,086 B2 * | 4/2008 | Abel et al. | 370/201 |
| 2001/0007136 A1 * | 7/2001 | Tamura et al. | 713/500 |
| 2001/0013850 A1 * | 8/2001 | Sakaguchi et al. | 345/87 |
| 2005/0200414 A1 * | 9/2005 | Morgan et al. | 330/261 |
| 2006/0268941 A1 * | 11/2006 | Paulson et al. | 370/503 |

* cited by examiner

*Primary Examiner* — Robert Beausoliel
*Assistant Examiner* — Dipakkumar Gandhi
(74) *Attorney, Agent, or Firm* — Martine Penilla & Gencarella, LLP (57) ABSTRACT

A method for aligning output from a first transmit source and a second transmit source is provided. The method includes combining complementary portions of differential signals generated from respective transmit sources to generate an output bit sequence and comparing the output bit sequence with an input bit sequence used to generate the differential signals. The method further includes adjusting one of the first or the second transmit source based on the comparison to align the output from the first and the second transmit sources. A PLD having the capability to align channels of different octets is also provided.

24 Claims, 5 Drawing Sheets

Fig. 5

PHASE-DETECTOR-LESS METHOD AND APPARATUS FOR MINIMIZING SKEW BETWEEN BONDED CHANNEL GROUPS

CROSS REFERENCE TO RELATED APPLICATIONS

This application claims priority from U.S. Provisional Patent Application No. 60/828,659, filed Oct. 9, 2006, and entitled "Phase-Detector-Less Method and Apparatus for minimizing Skew Between Bonded Channel Groups." This provisional application is herein incorporated by reference.

BACKGROUND

Programmable Logic Devices (PLD), such as field programmable gate arrays (FPGA) and other semiconductor devices have a bonded set of channels. These bonded channels have intentional skew compensation, either active or passive, to ensure that rising and falling edges of data coincide as nearly as possible in time with each other. For example, the Assignee's STRATIX™ II GX PLD utilizes a quad architecture, where four full duplex (transmit and receive) channels may be grouped to a common clock. A buffer amplifier on the clock line facilitates clocking an adjacent quad, accumulating the buffer delay in the skew. In this architecture, up to eight channels, i.e., two quads, can be bonded thereby resulting in all eight lines being within one clock buffer delay of each other as far as signal edge placement is concerned.

Recent developments have arisen where skew-aligned bonded signals of widths greater than eight bits are required. For example, Fully Buffered Dual In-line Memory Modules (FBDIMM) require ten bonded transmit channels, which may be referred to as lanes, which operate at speeds up to 4.8 Gbps per lane. In addition, Digital-to-Analog Converters (DAC) are currently available that require interfaces of 13 or 14 transmit bits that are operating at approximately 1.4 to 1.8 GSamples/sec for numerous radio frequency (RF) Direct Digital Synthesis (DDS) applications. Even within the test and measurement arena, as many vectors as possible need to be delivered simultaneously to a device under test. Given the current architecture described above, the lack of support for an application that requires more than eight bonded channels is becoming an issue.

Accordingly, there is a need to adapt the current architecture which provides groups of eight bonded channels to support devices requiring a greater number than eight bonded channels.

SUMMARY

Broadly speaking, the present invention fills these needs by providing a technique for combining multiple bonded channel groups. It should be appreciated that the present invention can be implemented in numerous ways, including as a method, a system, or an apparatus. Several inventive embodiments of the present invention are described below.

In one aspect of the invention, a method for aligning output from a first transmit source and a second transmit source is provided. The method includes combining complementary portions of differential signals generated from respective transmit sources to generate an output bit sequence and comparing the output bit sequence with an input bit sequence used to generate the differential signals. The method further includes adjusting one of the first or the second transmit source based on the comparison to align the output from the first and the second transmit sources. In one embodiment, an external phase lock loop combines the complementary portions of the differential signals, while the adjusting is performed on a separate chip, e.g., a programmable logic chip, such as a field programmable gate array. In another embodiment, each method operation is performed internally within a chip such as a chip representing a programmable logic device.

In another aspect of the invention a programmable logic device (PLD) is provided. The PLD includes multiple sets of channels, where each of the sets of channels includes a channel designated as a synchronization lane. While the embodiments described herein disclose a synchronization lane in each octet, a one channel copy of the other designated channel of the octet to be bonded is also sufficient. In this embodiment one channel per 16 channels is sacrificed rather than two channels per 16 channels being sacrificed. Each synchronization lane provides data to a corresponding differential buffer. The PLD includes a differential receive buffer receiving data from two different synchronization lanes where the data from the two different synchronization lanes is complementary. The PLD further includes a demultiplexer receiving the output of the receive buffer. The demultiplexer provides an output bit pattern and the output bit pattern is compared to the bit pattern or a table having acceptable bit patterns to determine whether to adjust a phase of the bit pattern. The phase of the bit pattern is adjusted over one of the synchronization lanes if necessary and then the resulting output bit pattern for the adjusted phase pattern is compared to the bit pattern or a table having acceptable bit patterns to determine whether to further adjust the phase of the bit pattern. In one embodiment, the phase adjustment is performed in the demultiplexers.

Other aspects and advantages of the invention will become apparent from the following detailed description, taken in conjunction with the accompanying drawings, illustrating by way of example the principles of the invention.

BRIEF DESCRIPTION OF THE DRAWINGS

Aspects of the present invention will become apparent from the following detailed description, taken in conjunction with the accompanying drawings, illustrating by way of example the principles of the invention.

DETAILED DESCRIPTION

An invention is described for a technique that enables alignment of bonded signal widths greater than eight bits with a device having an architecture configured to allow up to eight bonded channels. It will be obvious, however, to one skilled in the art, that the present invention may be practiced without some or all of these specific details. In other instances, well known process operations have not been described in detail in order not to unnecessarily obscure the present invention.

The embodiments discussed below describe a method and apparatus for supporting devices requiring skew aligned, bonded signal widths greater than eight bits with another device having an architecture configured to allow up to eight bonded channels. The embodiments described herein provide for an external technique or an internal technique to allow support for an application requiring more than eight bonded channels with a device having an architecture where channels are bonded in groups of eight. In the external technique, an external Phase Lock Loop (PLL) circuit is included to push or pull the reference clock for one group of eight channels, which may be referred to an octet, to align with a second group of eight channels. In the internal technique, no external circuitry is required as one transmit channel from each of the two octets is sacrificed to be used as a reference transmit channel, which may be referred to as a synchronization lane. A receiver will receive a true signal from a first synchronization lane and a complementary signal from the second synchronization lane. Based on the analysis of the output of this receiver, either the octet associated with the first synchronization lane or the octet associated with the second synchronization lane is adjusted so that the octets are adequately aligned for the application requiring more than eight bonded channels. One skilled in the art will appreciate that while the embodiments described herein refer to groups of eight bonded channels, i.e., octets, this is not meant to be limiting as the embodiments may be extended to any groups of multi-bonded channels. Furthermore, while the embodiments presented herein discuss aligning two groups of bonded channels, one skilled in the art will appreciate that the invention may be extended to aligning more than two groups of bonded channels.

Two different embodiments are described below that enable multiple bonded sets of channels from an existing architecture to support an application requiring signals of widths greater than the current architectures supports. In one embodiment an external phase lock loop (PLL) is provided in order to adjust the signals in order to meet the skew compensation required by the receiving device. In another embodiment, an internal technique is used where an all-digital phase compensation is applied to the output from multiple bonded channels in order to ensure the signals have the required skew compensation and coincide as nearly as possible in time with each other.

Figure 1:
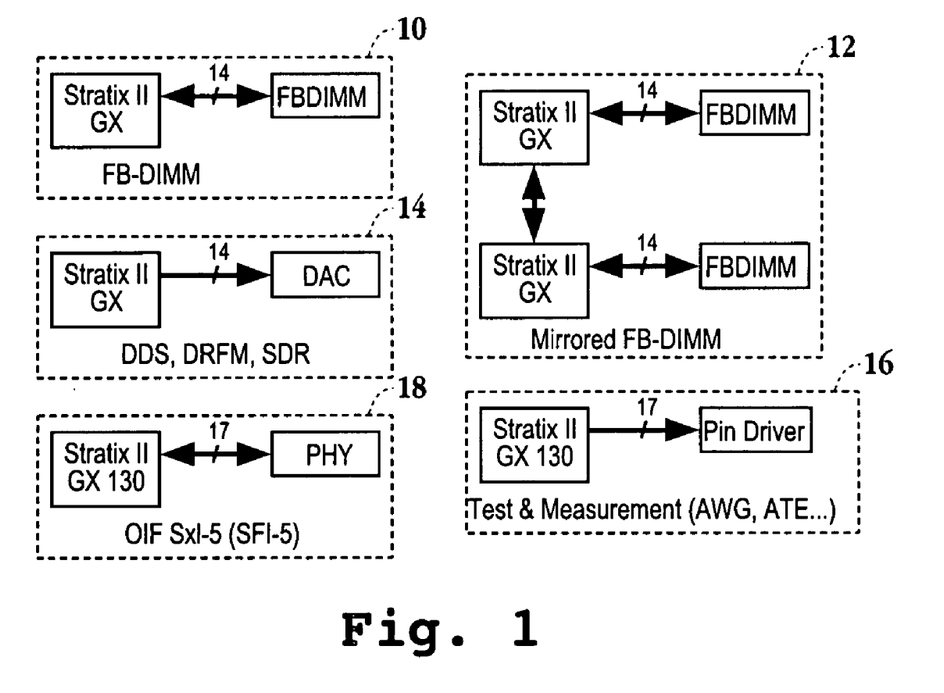
FIG. 1 is a simplified schematic diagram illustrating various applications of which the n-bonded transmit lanes may be applied in accordance with one embodiment of the invention.

FIG. 1 is a simplified schematic diagram illustrating various applications of which the n-bonded transmit lanes may be applied in accordance with one embodiment of the invention. In module 10, a PLD, e.g., those sold by the Assignee, is used to control access to an FBDIMM. As illustrated, the FBDIMM requires 10 lanes that are provided through the PLD by coordinating multiple bonded sets to achieve this signal width either through the internal or external technique described herein. In module 12, a mirrored FBDIMM application is illustrated, which may be considered an extension of the exemplary application of module 10. In module 14, a PLD is used to interface with a digital-to-analog controller (DAC) that requires a signal width of 14 bits. In module 16, the PLD may be used in a test and measurement application to interface with pin driver to provide as many vectors as possible. It should noted that in module 16, a signal width of 17 bits is provided and this may be achieved by applying the embodiments described herein to two octets and a quad, i.e., 20 channels where the octets and the quad each sacrifice one channel to leave 17. In module 18, the PLD interfaces with a physical layer device, framer, or processor, that requires lane bonding to high speed Input/Output protocols commonly employed, such as the SFIx.y or SPIm.n standards.

Figure 2:
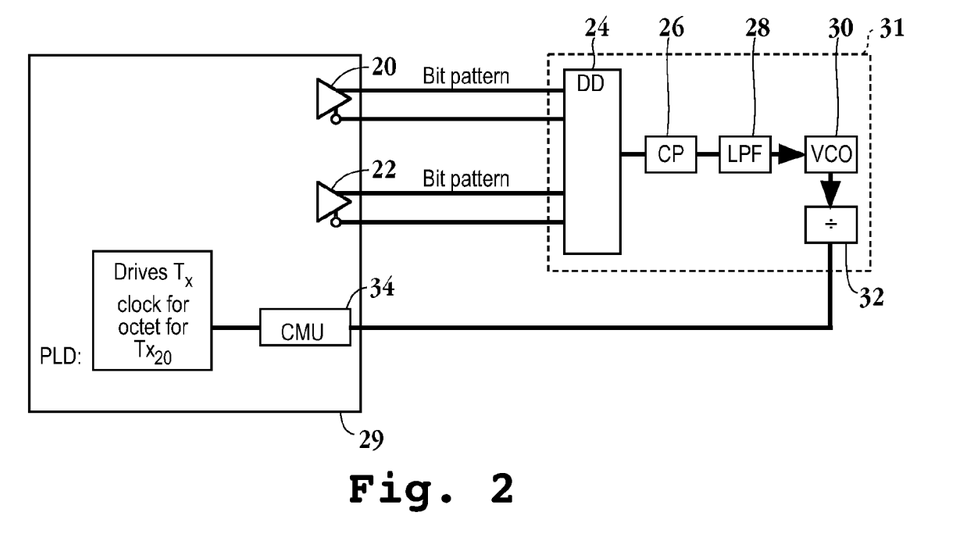
FIG. 2 is a simplified schematic diagram illustrating a technique to enable multiple octets to have their corresponding signals aligned through the use of an external phase lock loop in accordance with one embodiment of the invention.

FIG. 2 is a simplified schematic diagram illustrating an approach to enable multiple octets to have their corresponding signals aligned in accordance with one embodiment of the invention. In the approach, which may be referred to as the external technique, phase detector 24, charge pump 26, low pass filter 28 and voltage-controlled oscillator (VCO) 30, as well as divider 32 are introduced through additional chip 31, external to and in communication with chip 29, which may be a PLD. Here, two data streams from different octets are provided to the PLL of chip 31 and the edge placements are determined by sampling with a phase detector to determine advance/retard needs for one of the signals. It should be appreciated that the data stream generally needs to be slowed down to suitable speeds for the phase detector, therefore, a repetitive pattern of 1's and 0's may be used to create a low frequency align pattern. The frequency/phase of the voltage-controlled oscillator is adjusted until the edges match closely to some tolerance. Thus, transmit channel 20 would be associated with a first octet, while transmit channel 22 is associated with a second octet. Bit patterns from transmit synchronization channel 20 and transmit synchronization channel 22 are compared within the PLL circuit 31 in order to push or pull the phase of clock multiplier unit (CMU) that drives the transmit synchronization channel for the octet associated with transmit channel 20 until the patterns are aligned. One skilled in the art will appreciate that in one embodiment, since PLL circuit 31 is an analog circuit, enhanced accuracy for subunit intervals are possible as compared to the internal technique described below.

Figure 3:
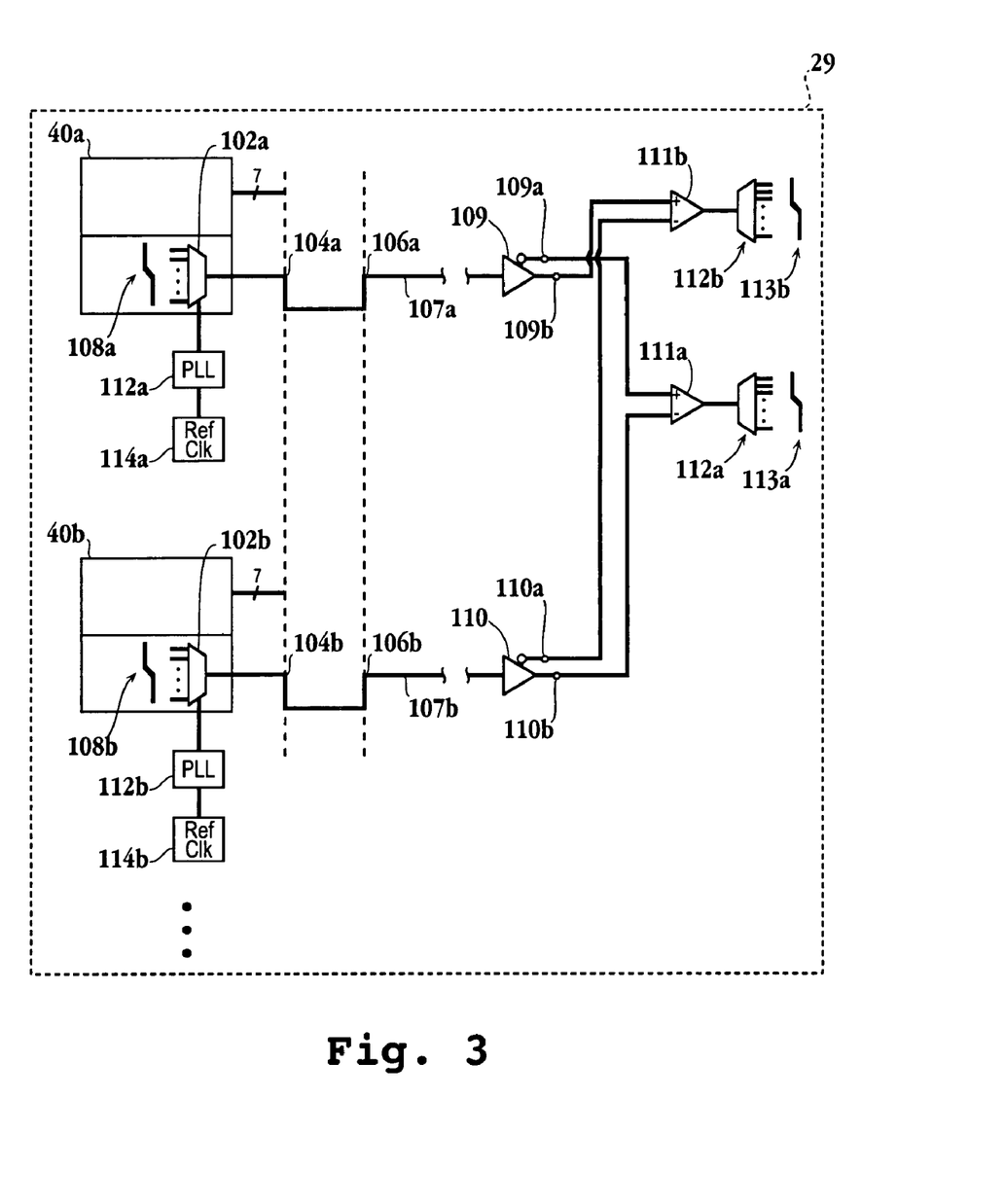
FIG. 3 is a simplified schematic diagram illustrating an internal technique for aligning the data from multiple bonded channels in order to provide the alignment of one group of channels to another group of channels in accordance with one embodiment of the invention.

FIG. 3 is a simplified schematic diagram illustrating an internal technique for aligning the data from multiple bonded channels in order to provide the alignment of one group of channels to another group of channels in accordance with one embodiment of the invention. It should be appreciated that in this embodiment, minimal resources are required and no external circuits are necessary. Within PLD 29 are octets 40a and 40b. In one embodiment, octets 40a and 40b are composed of two quads, i.e., two sets of four bonded channels. It should be appreciated that any suitable number of octets may be included within PLD 29, and in one embodiment the PLD may have 20 ports where each port includes an octet. As mentioned above, in one embodiment, a channel may be composed of two octets and a quad, i.e., if each octet includes eight channels then a total of 20 channels would be available in this configuration. For the internal embodiments described herein one channel is sacrificed from each octet. It should be appreciated that while the group of channels may be described as an octet in some embodiments herein, this is not meant to be limiting as the embodiments may be extended to any number of channels greater than or less than eight.

With regard to octet 40a of FIG. 3, the channel associated with multiplexer 102a is sacrificed and a known bit sequence is provided to this multiplexer, which is controlled by PLL 112a, which in turn, is in communication with reference clock 114a. PLL 112a and reference clock 114a provide the clock signal for octet 40a. In octet 40b, multiplexer 102b is provided the known bit sequence pattern, which is the same pattern being applied to multiplexer 102a. Multiplexer 102b is controlled through PLL 112b and reference clock 114b. The embodiments described herein aim to adjust edges 104a and 104b of the sequence patterns emanating from the corresponding multiplexers in order to closely align the data being provided from the different octets. Of course, once edges 104a and 104b are closely aligned, edges 106a and 106b will naturally be closely aligned. The known sequence pattern illustrated by patterns 108a and 108b is a sequence of ones and zeroes. In one embodiment, multiplexers 102a and 102b can receive 40 inputs, therefore, the patterns applied to these multiplexers is a sequence of 20 zeroes followed by a sequence of twenty ones. However, the embodiments described herein are not limited to this sequence as any suitable sequence may be used and it is not necessary to have the sequence portioned with 50% of one digital value and 50% of another digital value. The bit sequence emanating from multiplexer 102a will be represented by channel 107a, while the bit sequence from multiplexer 102b is represented by channel 107b. It should be noted that a register or multiple registers may contain the bits for each bit of the bit sequence may provide the corresponding multiplexers with the values. As multiplexers 102a and 102b come up in a random rotation, the embodiments described herein will synchronize that random rotation. It should be further appreciated that each multiplexer 102a and 102b are configured to accept a 40 bit word once a previous 40 bits have been shifted out in this embodiment. Of course, multiplexers 102a and 102b may be constructed to accept more or less than 40 bits depending on the application.

Continuing with FIG. 3, data from channel 107a is received by differential buffer 109 which takes a complement of the signal received and outputs that complement 109a to receive buffer 111a. Data from channel 107b is input into differential buffer 110 which forwards true signal 110b to receive buffer 111a. Complement signal 110a of the input received at differential buffer 110 is forwarded to receive buffer 111b. Likewise, the true signal 109b output from differential buffer 109 is transmitted to receive buffer 111b. Thus, receive buffers 111a and 111b are receiving signals from two different octets, as opposed to the common practice of sending a differential pair from a common octet. The output of corresponding buffers 111a and 111b is provided to de-multiplexers 112a and 112b, respectively. The bit sequence output from de-multiplexers 112a and 112b can then be analyzed and compared to known acceptable patterns, as discussed with regard to FIG. 4, in order to determine how to adjust one of the patterns being provided to multiplexers 102a or 102b. That is, the bit sequence pattern 113a provided by the output of de-multiplexer 112a can be analyzed either through comparing table values or some other suitable method in order to determine whether the pattern from either octet 40a or octet 40b must be adjusted.

It should be appreciated that while receive buffers 111a and 111b of FIG. 3 are both illustrated, it is only necessary to analyze the pattern from one of the receive buffers and only one buffer is minimally required. For illustrative purposes, both receive buffers 111a and 111b are illustrated in order to provide voting or polling capability. Where one receive buffer is employed, e.g., buffer 111a, signals 109b and 110a are not used and may be terminated at a receiver. The determination of whether pattern 113a closely matches either 108a or 108b, will be used to provide feed back to adjust the phase of the pattern being output from multiplexers 102a or 102b, respectively. If pattern 113a closely matches the expected corresponding pattern (either 108a or 108b) then there is no adjustment necessary. However, where the pattern from 113a does not closely match the expected corresponding input pattern, an adjustment may be made through rotation of the bit sequence provided to the corresponding multiplexer or some other suitable means such as skipping a clock cycle, etc. The adjustments made to the sacrificed channels is made for each of any of the remaining channels to ensure the alignment of the signals across multiple octets.

As illustrated in FIG. 3, one transmit channel, e.g., channels 107a and 107b, from each of the two groups is sacrificed for this embodiment. It should be noted that a transmit channel may be referred to as a reference or synchronization channel. Transmit channels 107a and 107b contain information about the skew of their respective group or octet. In one embodiment, a pattern is imposed on this group, which would normally be composed of data at very high gigabit speeds. This embodiment recognizes that the data on each channel is generated by a parallel word of N bits. If a pattern is generated on each reference channel, represented as a sequence of N/2 identical bits, followed immediately in time by a complementary sequence of N/2 identical bits, a clock pattern with a 50% duty cycle is generated. If desired, one can also generate a pattern of substantially lower frequency by simply defining M bits in length where M/2 identical bits are followed immediately in time by a complementary sequence of M/2 identical bits. This pattern is replicated on both sets of transmit reference channels 107a and 107b, one from each 8-bit bonded group, and in such a fashion, that the "framing" of this pattern corresponds to the "framing" (word boundary) of the bonded data to be transmitted. While the embodiment suggests the use of dedicated synchronization channels, actual data lanes themselves may be used if the patterns can be replicated in the data path at a known instant in time across octets.

The relative placement of these reference edges now defines the skew between these two groups. In one embodiment, each of these two reference channels is actually a differential pair of wires, one true, the other complement, as opposed to the differential pair from one transmitter being fed as the pair of signals for the differential input of a receiver. The receiver subtracts the complement signal from the true signal to obtain an error signal that is double in amplitude of each of the differential signals, and rejects any common signal, since a common signal typically includes noise, which is subtracted from itself. In the exemplary embodiments described herein, the true signal is taken from a first reference channel and the complement signal is taken from a second reference channel, however, the true signal and the complement signal can be sent to the second and the first reference channel, respectively. These two signals are fed to a single pair of differential inputs on one receiver. It should be appreciated that if the transmit and receive data paths are symmetrical and 14 bits are used, 2 bits in transmit are used for reference channels, and two receiver channels are left unused, one of which is used herein. Of course, the second receive channel may be used as described above. In essence, the differential receiver acts as a phase detector.

It should be appreciated that when there is skew between the channels, the ideality of M/2 bits in sequence is lost. This is determined by going through the standard clock data recovery (CDR) block and de-multiplexing the data, allowing the sequence to be easily analyzed at low speed. Since the data is being fed back into the same PLD, bits can be stuffed or deleted, or clocks can be adjusted either by analog techniques or by skipping/inserting pulses or adjusting pointers until the best correlation to an M/2 sequence of bits is achieved, as depicted herein. In practice, such a technique is prone to sampling error. In the case of FBDIMM, 3.5 UI (3.5 times the single-bit period on the gigabit channel) is allowed and the embodiments are expected to be within one to 1.5 UI, making this phase adjust circuit, with no external components, sufficient. In the case of a digital to analog converter (DAC), the setup and hold of the DAC precludes anything more than 0.5

UI of phase accuracy between bits. In this case, the transmit data is "oversampled", where it is increased in speed by some multiple. Here, the M/2 is resolved to a greater level than the transitions associated with the real data changes, and a subbit-time resolution is achieved in adjusting the phase. Thus, the internal embodiment may align data within one or two bit times in normal mode, and to fractional bit times when overclocked/oversampled. In the event the system is noisy or has direct current (DC) offsets among the reference transmit channels, a common mode adjustment "bias tee" or other mechanism may be used, as well as possibly having differing amplitudes on each reference transmit channel.

Figure 4:
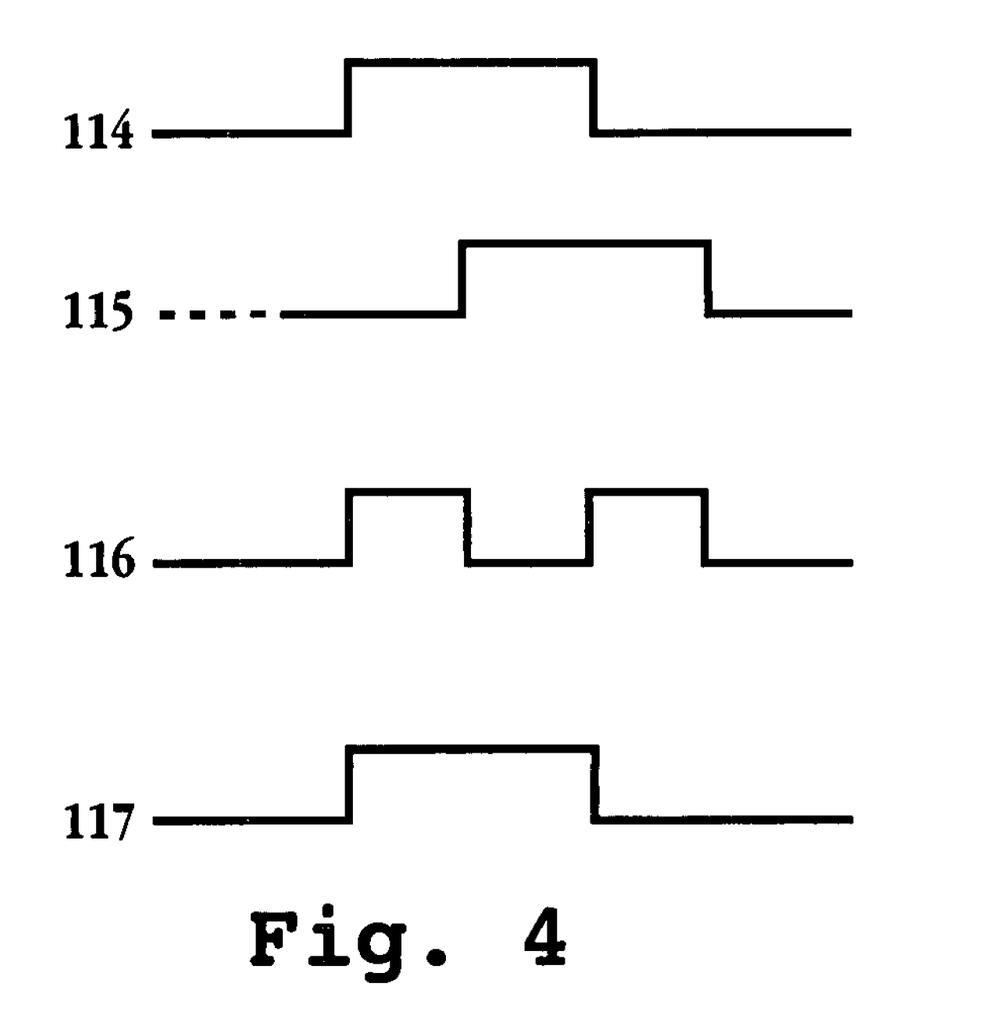
FIG. 4 is a simplified schematic diagram illustrating various clock cycles that may be representative of the clock cycles output from FIG. 3 in accordance with one embodiment of the invention.

FIG. 4 is a simplified schematic diagram illustrating various clock cycles that may be representative of the clock cycles output from FIG. 3 in accordance with one embodiment of the invention. Clock cycle 114 may be the desired clock cycle, i.e., the input bit sequence, while clock cycle 115 may illustrate the clock cycle output as 113a of FIG. 3. The subtraction of these cycles will result in the pattern illustrated in cycle 116. Where cycles 114 and 115 are perfectly aligned then the pattern resulting will be illustrated in clock cycle 117. However, the embodiments described herein also allow for some skew as being acceptable. In one embodiment, up to 3.5 unit intervals of skew is acceptable. Thus, it may be possible to have an acceptable clock cycle that does not match the input clock cycle exactly because of the allowable skew. Thus, there may be a table of clock patterns that are acceptable, and the output from the differential receiver can be compared to the patterns in this table to determine whether the alignment is acceptable and how much adjustment is anticipated. Where the transmit and receive channels are in differing devices or locations, such adjustments may be communicated to the transmit or receive device. Bit adjustments may also occur in the demultiplexer and are not constrained to adjustments in the transmitter.

Figure 5:
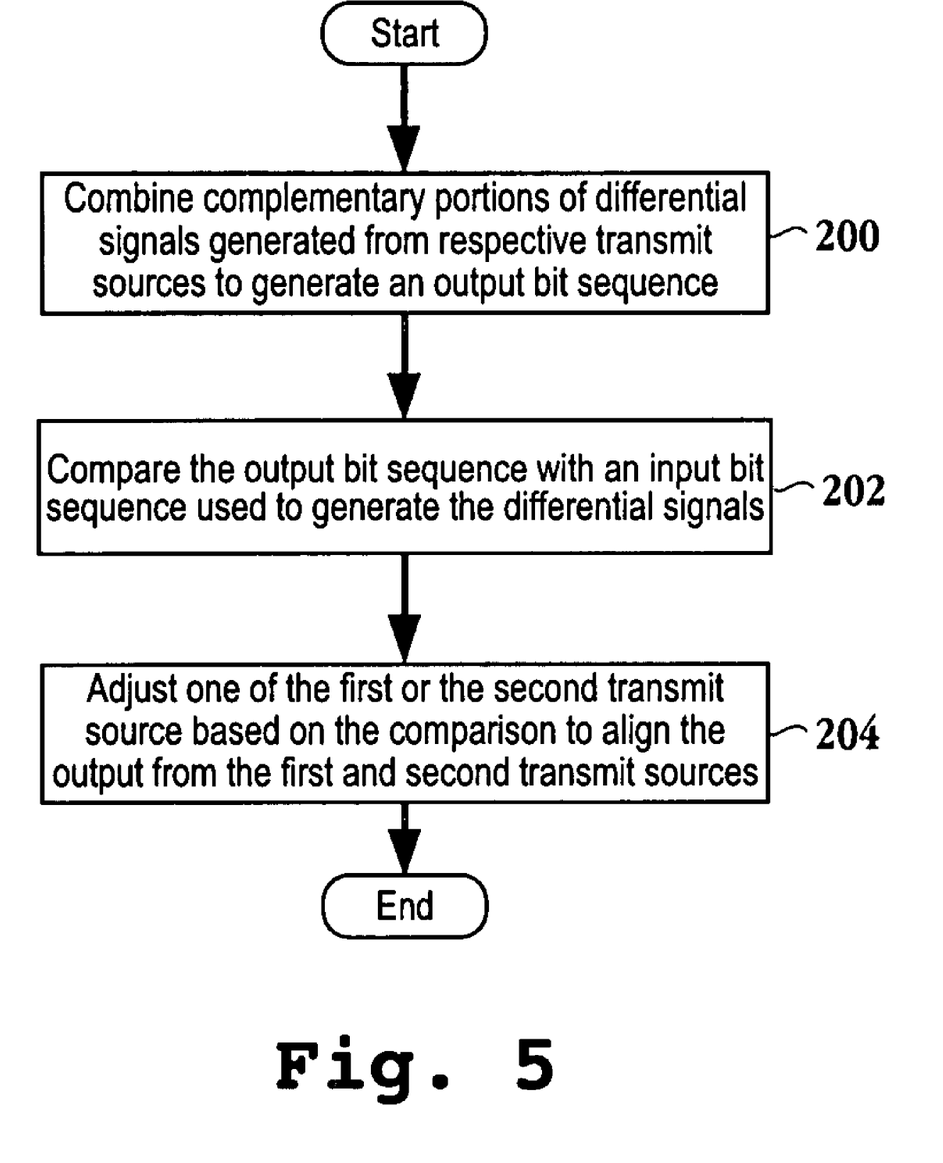
FIG. 5 is a flowchart diagram illustrating the method operations for aligning output from a first transmit source and a second transmit source in accordance with one embodiment of the invention.

FIG. 5 is a flowchart diagram illustrating the method operations for aligning output from a first transmit source and a second transmit source in accordance with one embodiment of the invention. The method initiates with operation 200 where complementary portions of differential signals generated from respective transmit sources are combined to generate an output bit sequence. As mentioned above, the complementary portions are generated from different transmit sources as described with reference to FIGS. 2 and 3. The method then advances to operation 202 where the output bit sequence is compared with an input bit sequence used to generate the differential signals or alternatively, a table of acceptable sequence patterns. In one embodiment, the comparison is performed on the same chip, i.e., the technique is the internal technique described with respect to FIG. 3. In another embodiment, the comparison is performed on an external chip, i.e., the technique is the external technique described with respect to FIG. 2. The method then proceeds to operation 204 where one of the first or the second transmit sources is adjusted based on the comparison to align the output from the first and the second transmit sources. In the external technique, the PLL will push or pull the reference clock for one of the first or the second transmit source. In the internal technique, digital phase compensation techniques, such as rotation of the bit sequence provided to the corresponding multiplexer or some other suitable means such as skipping a clock cycle, etc, are employed.

The embodiments, thus far, were described with respect to PLDs. The method and apparatus for in-system programmability, described herein may be incorporated into any suitable circuit. For example, the method and apparatus may be incorporated into other types of devices such as a programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be the STRATIX® II GX devices owned by the assignee.

Any of the operations described herein that form part of the invention are useful machine operations. The invention also relates to a device or an apparatus for performing these operations. The apparatus can be specially constructed for the required purpose, or the apparatus can be a general-purpose computer selectively activated, implemented, or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims. It should be appreciated that exemplary claims are provided below and these claims are not meant to be limiting for future applications claiming priority from this application. The exemplary claims are meant to be illustrative and not restrictive.

What is claimed is:

1. A method for aligning a plurality of transmit sources, comprising method operations of:
   transmitting a bit sequence pattern over a corresponding channel of the plurality of transmit sources to respective differential buffers;
   generating differential signals from the respective differential buffers;
   combining a differential signal from a first differential buffer with a complementary differential signal from a second differential buffer to generate a combined signal pattern; and
   comparing the combined signal pattern to an acceptable bit sequence pattern to determine whether to adjust one of the plurality of transmit sources for alignment.

2. The method of claim 1, wherein the corresponding channel is associated with a group of eight transmit sources.

3. The method of claim 1 wherein a polarity of the differential signal and the complimentary differential signal are different and wherein the acceptable bit sequence pattern is the bit sequence pattern.

4. The method of claim 1, further comprising:
adjusting the bit sequence pattern when the combined signal pattern does not match the acceptable bit sequence pattern.

5. The method of claim 1, wherein the method operation of comparing the combined signal pattern to an acceptable bit sequence pattern to determine whether to adjust one of the plurality of transmit sources for alignment includes,
accessing a table storing the acceptable bit sequence pattern; and
determining if a skew between the combined signal pattern and the acceptable bit sequence pattern is within a number of unit intervals.

6. A method for aligning signals from a plurality of sources, comprising method operations of:
transmitting a bit sequence pattern over a channel of each of the plurality of sources;
generating synchronization lanes on each channel;
combining a signal polarity and a complementary signal polarity from different synchronization lanes to generate an output bit sequence pattern;
adjusting output from one of the plurality of sources based on comparison of the output bit sequence pattern with the bit sequence pattern.

7. The method of claim 6, wherein the method operation of adjusting output from one of the plurality of sources based on comparison of the output bit sequence pattern with the bit sequence pattern includes,
one of pushing or pulling a phase of the bit sequence pattern through a phase lock loop.

8. The method of claim 6, wherein the method operation of adjusting output from one of the plurality of sources based on comparison of the output bit sequence pattern with the bit sequence pattern includes,
one of flipping bits of the bit sequence pattern or rotating bits of the bit sequence pattern.

9. The method of claim 6, wherein the method operation of generating synchronization lanes on each channel includes,
oversampling one of the synchronization lanes as compared to another of the synchronization lanes.

10. The method of claim 6, wherein the method operation of combining a signal polarity and a complementary signal polarity from different synchronization lanes to generate an output bit sequence pattern includes,
receiving input from a synchronization lane into a differential buffer.

11. A method for aligning output from a first transmit source and a second transmit source, comprising method operations of:
combining complementary portions of differential signals generated from respective transmit sources to generate an output bit sequence;
comparing the output bit sequence with an input bit sequence used to generate the differential signals; and
adjusting one of the first or the second transmit source based on the comparison to align the output from the first and the second transmit sources.

12. The method of claim 11 wherein the complementary portions of the differential signals are generated through separate differential buffers.

13. The method of claim 12, wherein the separate differential buffers transmit the complementary portions to a single receive buffer.

14. The method of claim 11, further comprising:
repeating the combining, the comparing and the adjusting until the output from the first and the second transmit sources are aligned.

15. The method of claim 11, wherein the method operation of combining complementary portions of differential signals generated from respective transmit sources to generate the output bit sequence is performed on a separate chip from the method operation of the adjusting one of the first or the second transmit source based on the comparison to align the output from the first and the second transmit sources.

16. The method of claim 11, wherein the method operation of combining complementary portions of differential signals generated from respective transmit sources to generate the output bit sequence is performed on a same chip as the method operation of the adjusting one of the first or the second transmit source based on the comparison to align the output from the first and the second transmit sources.

17. The method of claim 11, wherein the method operation of adjusting one of the first or the second transmit source based on the comparison to align the output from the first and the second transmit source includes,
adjusting the output bit sequence; and
providing the adjusted output bit sequence to the one of the first or the second transmit source.

18. A method for aligning output from a first and a second transmit sources, comprising method operations of:
generating a bit pattern having a frequency that is a fraction of an operating frequency to be output by the first and the second transmit sources;
generating differential signals from each respective bit pattern;
combining complementary portions of differential signals, where one portion is associated with the first transmit source and another portion is associated with the second transmit source;
adjusting a phase of the bit pattern of the first transmit source based on a comparison of an output from the combining and the bit pattern; and
applying the adjusting to remaining channels within the first transmit source.

19. The method of claim 18, wherein the method operation of combining complementary portions of differential signals, where one portion is associated with the first transmit source and another portion is associated with the second transmit source includes
receiving into a single receive buffer the one portion from a first differential buffer and the another portion from a second differential buffer; and
outputting the combined complimentary portion to a demultiplexer.

20. The method of claim 18, wherein the method operation of combining complementary portions of differential signals, where one portion is associated with the first transmit source and another portion is associated with the second transmit source is performed on a separate chip from the remaining method operations.

21. A programmable logic device (PLD), comprising:
a first and a second set of channels, wherein each of the first set and the second set of channels includes a channel designated as a synchronization lane over which a bit pattern is transmitted;
a first differential buffer receiving data from the channel designated as the synchronization lane for the first set;

a second differential buffer receiving data from the channel designated as the synchronization lane for the second set;

a receive buffer receiving both an output signal having a polarity from the first differential buffer and an output signal having a complementary polarity from the second differential buffer; and a demultiplexer receiving output of the receive buffer, the demultiplexer providing an output bit pattern, wherein the output bit pattern is compared to the bit pattern to determine whether to adjust a phase of the bit pattern over the channel of one of the first or the second set of channels.

22. The PLD of claim 21, wherein the first set of channels include two sets of four bonded channels.

23. The PLD of claim 21, wherein each component is located within an Input/Output ring of the PLD and the PLD is a field programmable gate array.

24. The PLD of claim 21, further comprising:

a demultiplexer receiving output of the receive buffer, the demultiplexer providing an output bit pattern, wherein the output bit pattern is compared to the to determine whether to adjust a phase of the bit pattern over the channel of one of the first or the second set of channels.

* * * * *